United States Patent
Zhang et al.

(10) Patent No.: US 9,861,014 B2
(45) Date of Patent: Jan. 2, 2018

(54) AUTOMATIC CONTROL SYSTEM AND METHOD OF CHILLERS FOR DATA CENTER

(71) Applicant: BEIJING BAIDU NETCOM SCIENCE AND TECHNOLOGY CO., LTD., Beijing (CN)

(72) Inventors: Shu Zhang, Beijing (CN); Guofeng Chen, Beijing (CN); Ruiquan Ding, Beijing (CN)

(73) Assignee: BEIJING BAIDU NETCOM SCIENCE AND TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/392,318

(22) PCT Filed: Oct. 28, 2014

(86) PCT No.: PCT/CN2014/089727
§ 371 (c)(1),
(2) Date: Dec. 24, 2015

(87) PCT Pub. No.: WO2015/090114
PCT Pub. Date: Jun. 25, 2015

(65) Prior Publication Data
US 2016/0295750 A1    Oct. 6, 2016

(30) Foreign Application Priority Data
Dec. 17, 2013  (CN) .......................... 2013 1 0692639

(51) Int. Cl.
*H05K 7/20* (2006.01)
*F24F 11/00* (2006.01)

(52) U.S. Cl.
CPC ...... *H05K 7/20836* (2013.01); *F24F 11/0012* (2013.01); *H05K 7/20818* (2013.01);
(Continued)

(58) Field of Classification Search
CPC ............ H05K 7/20836; H05K 7/20818; F24F 11/0012; F24F 2011/0047; G05B 2219/2614
See application file for complete search history.

(56) References Cited

U.S. PATENT DOCUMENTS

2008/0154534 A1*  6/2008  Bash ...................... G01K 1/026
                                                       702/130

FOREIGN PATENT DOCUMENTS

CN        202548738 U      11/2012
CN        203349433 U      12/2013
(Continued)

OTHER PUBLICATIONS

English Translation of the International Search Report corresponding to International Application No. PCT/CN2014/089727, dated Jan. 28, 2015, 2 pages.
(Continued)

*Primary Examiner* — Carlos Ortiz Rodriguez
(74) *Attorney, Agent, or Firm* — Lathrop Gage LLP

(57) ABSTRACT

An automatic control system and method of chillers for a data center are provided. The control system includes: a plurality of servers; a plurality of first temperature sensors, mounted at air inlets of the plurality of servers, respectively, and configured to detect temperatures at the air inlets of the plurality of servers in a real-time manner, respectively; a controller, configured to receive detected temperatures sent by the plurality of first temperature sensors, calculate an average temperature in the data center according to the detected temperatures, and generate a control instruction according to the average temperature in the data center; and an air conditioner, configured to receive the control instruction sent by the controller, and adjust a working mode of the air conditioner according to the control instruction.

16 Claims, 2 Drawing Sheets

(52) U.S. Cl.
CPC ............... *F24F 2011/0047* (2013.01); *G05B 2219/2614* (2013.01)

(56) References Cited

FOREIGN PATENT DOCUMENTS

| | | |
|---|---|---|
| CN | 103644632 A | 3/2014 |
| CN | 103673200 A | 3/2014 |

OTHER PUBLICATIONS

International Preliminary Report on Patentability (Chapter II) corresponding to International Application No. PCT/CN2014/089727, dated Apr. 17, 2016, with English Translation, 9 pages.
Chinese Patent Application No. 201316926396, First Office Action dated Feb. 26, 2015, 10 pages.

* cited by examiner

AUTOMATIC CONTROL SYSTEM AND METHOD OF CHILLERS FOR DATA CENTER

CROSS-REFERENCE TO RELATED APPLICATION

The application is a U.S. national phase entry of PCT Application No. PCT/CN2014/089727 filed on Oct. 28, 2014, which claims a priority to and benefits of Chinese Patent Applications No. 201310692639.6, filed with the State Intellectual Property Office of P. R. China on Dec. 17, 2013, the entire contents of which are incorporated herein by reference.

FIELD

The present disclosure relates to the field of computer technology, and more particularly to an automatic control system and method of chillers for a data center.

BACKGROUND

A data center is built for providing a server disposed therein a good operation environment. Specifically, in the view of ensuring the server a reliable temperature, a refrigeration system is provided for meeting requirements to heat dissipation of the server. The refrigeration system is designed by ensuring a certain inlet air amount and a certain inlet air temperature, such that components in the server meet the requirements to the reliable temperature for the server. Therefore, the refrigeration system in the data center is designed to guarantee a cold aisle therein the certain temperature within a certain range, and the certain inlet air amount meeting the requirements.

Currently, the existing refrigeration system for the data center generally performs its refrigeration function under control of a temperature in the data centre (taken as a control parameter) detected by a limited number of temperature sensors mounted at an air outlet of an air conditioner or in a cold/warm aisle. However, the data center is of a uniform temperature inside affected by various factors, e.g., a specific layout of a machine room, actual power consumption or placement of the server. Therefore, it is impossible for the limited number of the temperature sensor in the related art to reflect a temperature fluctuation and change inside the data centre precisely, i.e., the temperature fluctuation and change inside the data centre cannot be reflected precisely with the limited number of the temperature sensor. As a result, it is easy for the refrigeration system to be of an over circumspect control strategy which results in excessive refrigeration and power consumption therefrom; or of an over radical control strategy which results in insufficient refrigeration and an over high temperature in the data centre locally, and thus increasing a probability of work failures. Furthermore, it often needs an administrator to adjust the refrigeration control strategy depending on personal experience because of the inaccurate control parameters of the refrigeration system, resulting in labour cost and low operation and maintenance efficiency of the refrigeration system. Furthermore, the refrigeration system and the refrigeration control strategy in the related art are not suitable for a more complicate data center with a larger scale to be operated in a more efficient manner in the future.

SUMMARY

The present disclosure aims to solve at least one of above technical problems in the related art.

Therefore, a first object of the present disclosure is to provide an automatic control system of chillers for a data center, so as to avoid a refrigeration control strategy from being over circumspect which results in excessive refrigeration or being over radical which results in insufficient refrigeration on the premise of guaranteeing a server sufficient heat dissipation, thereby greatly reducing power consumption for refrigeration and a failure rate of the server.

A second object of the present disclosure is to provide an automatic control method of chillers for a data center.

A third object of the present disclosure is to provide a storage medium.

In order to achieve the objects described above, embodiments of the first aspect of the present disclosure provide the automatic control system of the chillers for the data center, including:

a plurality of servers;

a plurality of first temperature sensors, mounted at air inlets of the plurality of servers, respectively, and configured to detect temperatures at the air inlets of the plurality of servers in a real-time manner, respectively;

a controller, configured to receive detected temperatures sent by the plurality of first temperature sensors, calculate an average temperature in the data center based on the detected temperatures, and generate a control instruction according to the average temperature in the data center; and an air conditioner, configured to receive the control instruction sent by the controller, and adjust a working mode of the air conditioner according to the control instruction.

According to embodiments of the present disclosure, the automatic control system of the chillers for the data center may detect the air inlet temperature of the server in a real-time manner by disposing the first temperature sensor at the air inlet of the server, and may directly take the air inlet temperature of the server as a control parameter to control the air conditioner. Thus, the controller may generate the control instruction in a real-time and dynamic manner according to the air inlet temperature and adjust the working mode of the air conditioner according to the control instruction. As a result, on one hand, the automatic control system of the chillers may avoid the refrigeration control strategy from being over circumspect which results in excessive refrigeration or being over radical which results in insufficient refrigeration on the premise of guaranteeing the server sufficient heat dissipation, thereby greatly reducing power consumption for refrigeration and the failure rate of the server. On the other hand, the automatic control system of the chillers may avoid labours from adjusting the refrigeration control strategy at regular intervals as many as possible, thus reducing labour cost, improving the operation and maintenance efficiency and meeting requirements to automatic and high efficient operation of the large scale data centre in the future.

In order to achieve the objects described above, embodiments of the second aspect of the present disclosure provide the automatic control method of the chillers for the data center, including:

detecting temperatures at an air inlets of a plurality of servers in a real-time manner;

calculating an average temperature in a data center based on detected temperatures; and generating a control instruction according to the average temperature in the data center, and adjusting a working mode of an air conditioner according to the control instruction.

According to embodiments of the present disclosure, the automatic control method of the chillers for the data center may detect the air inlet temperature of the server in a real-time manner, and may directly take the air inlet temperature of the server as a control parameter to control the air conditioner. Thus, the controller may generate the control instruction in a real-time and dynamic manner according to the air inlet temperature and adjust the working mode of the air conditioner according to the control instruction. As a result, on one hand, the automatic control system of the chillers may avoid the refrigeration control strategy from being over circumspect which results in excessive refrigeration or being over radical which results in insufficient refrigeration on the premise of guaranteeing the server sufficient heat dissipation, thereby greatly reducing power consumption for refrigeration and the failure rate of the server. On the other hand, the automatic control system of the chillers may avoid labours from adjusting the refrigeration control strategy at regular intervals as many as possible, thus reducing labour cost, improving the operation and maintenance efficiency and meeting requirements to automatic and high efficient operation of the large scale data centre in the future.

In order to achieve the objects described above, embodiments of the third aspect of the present disclosure provide a storage medium for use in storing an application, configured to perform the automatic control method of the chillers for the data centre as described in embodiments of the present disclosure during being operated.

According to embodiments of the present disclosure, the storage medium may detect the air inlet temperature of the server in a real-time manner, and may directly take the air inlet temperature of the server as a control parameter to control the air conditioner. Thus, the controller may generate the control instruction in a real-time and dynamic manner according to the air inlet temperature and adjust the working mode of the air conditioner according to the control instruction. As a result, on one hand, the automatic control system of the chillers may avoid the refrigeration control strategy from being over circumspect which results in excessive refrigeration or being over radical which results in insufficient refrigeration on the premise of guaranteeing the server sufficient heat dissipation, thereby greatly reducing power consumption for refrigeration and the failure rate of the server. On the other hand, the automatic control system of the chillers may avoid labours from adjusting the refrigeration control strategy at regular intervals as many as possible, thus reducing labour cost, improving the operation and maintenance efficiency and meeting requirements to automatic and high efficient operation of the large scale data centre in the future.

Additional aspects and advantages of embodiments of present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the drawings, in which.

DETAILED DESCRIPTION

Figure 1:
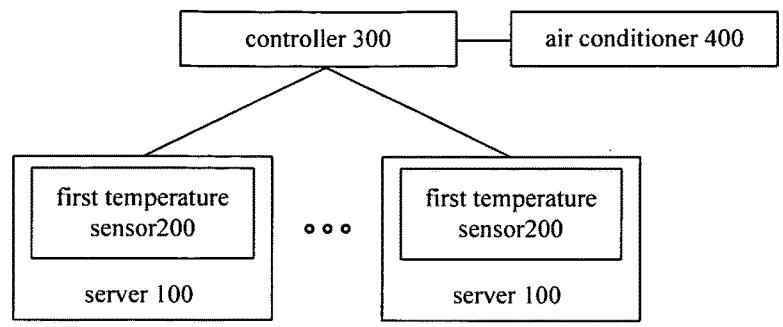
FIG. 1 is a schematic diagram showing an automatic control system of chillers for a data center according to an embodiment of the present disclosure.

Embodiments of the present disclosure will be described in detail and examples of the embodiments will be illustrated in the drawings, where same or similar reference numerals are used to indicate same or similar members or members with same or similar functions. The embodiments described herein with reference to drawings are explanatory, which are used to illustrate the present disclosure, but shall not be construed to limit the present disclosure.

In addition, terms such as "first" and "second" are used herein for purposes of description and are not intended to indicate or imply relative importance or significance or to imply the number of indicated technical features. In the present disclosure, unless specified or limited otherwise, the terms "mounted", "connected", "coupled", "fixed" and the like are used broadly, and may be, for example, fixed connections, detachable connections, or integral connections; may also be mechanical or electrical connections; may also be direct connections or indirect connections via intervening structures; may also be inner communications of two elements, which may be understood by those skilled in the art according to specific situations. In the description of the present disclosure, "a plurality of" means at least two, e.g. two, three and so on, unless specified otherwise.

Any process or method described in a flow chart or described herein in other ways may be understood to include one or more modules, segments or portions of codes of executable instructions for achieving specific logical functions or steps in the process, and the scope of a preferred embodiment of the present disclosure includes other implementations, which should be understood by those skilled in the art.

With reference to drawings, an automatic control system and method of chillers for a data center are described hereinafter according to embodiments of the present disclosure.

Currently, the existing refrigeration system for the data center generally detects a temperature in the data centre detected by a limited number of temperature sensors mounted at an air outlet of an air conditioner or in a cold/warm aisle. However, it is impossible for such a method to reflect nonuniform temperatures inside the data center accurately. As a result, it is easy for the refrigeration system to be of an over circumspect control strategy which results in excessive refrigeration; or of an over radical control strategy which results in insufficient refrigeration when using these temperature information as the control parameter.

If a real-time temperature of a server in a data center can be collected directly, it may avoid the excessive refrigeration and the insufficient refrigeration on the premise of guaranteeing the server sufficient heat dissipation, thereby greatly reducing power consumption for refrigeration and the failure rate of the server by giving a feedback of collected real-time temperature to a controller and adjusting the refrigeration system with the controller in a real-time manner, so as to reduce power consumption as much as possible. Therefore, the present disclosure provides in embodiments an automatic control system of chillers for a data center is provided by, including:

a plurality of servers;

a plurality of first temperature sensors, mounted at air inlets of the plurality of servers, respectively, and configured to detect temperatures at the air inlets of the plurality of servers in a real-time manner, respectively;

a controller, configured to receive detected temperatures sent by the plurality of first temperature sensors, calculate an average temperature in the data center based on the detected temperatures, and generate a control instruction according to the average temperature in the data center; and an air conditioner, configured to receive the control instruction sent by the controller, and adjust a working mode of the air conditioner according to the control instruction.

FIG. 1 is a schematic diagram showing an automatic control system of chillers for a data center according to an embodiment of the present disclosure.

As shown in FIG. 1, the automatic control system of the chillers for the data center includes a plurality of servers 100, a plurality of first temperature sensors 200, a controller 300 and an air conditioner 400.

Specifically, the plurality of first temperature sensors 200 may be mounted at air inlets of the plurality of servers 100, respectively, and configured to detect temperatures at the air inlets of the plurality of servers 100 in a real-time manner, respectively. More specifically, one machine room of the data center is generally provided with a plurality of servers 100. Therefore, the first temperature sensor 200 needs to be disposed at the air inlet of each server 100. One first temperature sensor 200 may be disposed at the air inlet of each server 100; or two or more first temperature sensors 200 may be disposed at the air inlet of each server 100. The first temperature sensor 200 may detect the temperatures at the air inlets of the servers 100 in a real-time manner, and then the first temperature sensors 200 send the temperatures at the air inlets detected by themselves, which are taken as the detected temperature, to the controller 300.

It should be understood, in another embodiment of the present disclosure, the first temperature sensor 200 may also be mounted at an air outlet of the server 100 and configured to detect a temperature at an air outlet of the server 100. However, the temperature at the air inlet of the server 100 should be as low as possible theoretically, while the temperature at the air outlet of the server 100 should be as high as possible, as a result, the temperature at the air inlet of the server 100 should be preferably chosen as the control parameters of the refrigeration system during designing heat dissipation of the server 100.

The controller 300 is configured to receive detected temperatures sent by the plurality of first temperature sensors 200, calculate an average temperature in the data center based on the detected temperatures, and generate a control instruction according to the average temperature in the data center. More specifically, after receiving the detected temperatures detected by the first temperature sensors 200, the controller 300 may calculate an arithmetic mean value based on all detected temperatures, and the arithmetic mean value obtained by calculating based on the detected temperatures is taken as the average temperature in the data center. Subsequently, the controller 300 may send a control instruction, which is generated according to the average temperature, to the air conditioner 400.

The air conditioner 400 is configured to receive the control instruction sent by the controller, and adjust a working mode of the air conditioner according to the control instruction. More specifically, after receiving the control instruction sent by controller 300, the air conditioner 400 may adjust the working mode according to the control instruction. Specifically, the working mode may include a rotation rate of a fan, a refrigeration temperature of the air conditioner 400. In other words, the air conditioner 400 may satisfy the requirements to an inlet air amount and an inlet air temperature at the air inlet of the server 100 by adjusting an air supply amount and an air supply temperature itself, so as to ensure the server 100 being operated stably.

Furthermore, the air conditioner 400 controlling an opening rate of the freeze water valve of a coiler end of the air conditioner 400 is taken as an example. The air conditioner 400 obtains a control temperature to be adjusted according to the control instruction, and then compares the control temperature with a current air supply temperature of the air conditioner 400. If the control temperature is greater than the air supply temperature, the air conditioner 400 may control freeze water supply pipe valve to decrease the opening rate of the freeze water supply pipe valve, so as to increase the current air supply temperature of the air conditioner 400. If the control temperature is less than the air supply temperature, the air conditioner 400 may control the freeze water supply pipe valve to increase the opening rate of the freeze water supply pipe valve, so as to decrease the current air supply temperature of the air conditioner 400:

Furthermore, the air conditioner 400 controlling the rotation rate of the fan in the air conditioner 400 is also taken as an example. The air conditioner 400 controls the rotation rate of the fan in the air conditioner 400 according to the control instruction. Based on the design of the server 100, a relationship between a ventilation quantity and the rotation rate of the fan in the server 100 may be established in advance. This relationship may be measured by a related technique, e.g., a wind tunnel test, which is no elaborated herein. Preferably, the air supply quantity of the fan in the air conditioner 400 may be equal to the air quantity required by all servers in the machine room, i.e., the air supply quantity of the fan is equal to a sum of the ventilation quantities of all servers 100. Therefore, the rotation rate of the fan may be adjusted in a real-time manner according to the sum of the ventilation quantities of all servers 100, so as to reduce power consumption by the fan and avoid the cold aisles from backflow and detour flow caused by an over air supply quantity or an overheat air supply, thus reducing the power consumption by the refrigeration of the air conditioner 400.

According to embodiments of the present disclosure, the automatic control system of the chillers for the data center may detect the air inlet temperature of the server in a real-time manner by disposing the first temperature sensor at the air inlet of the server, and may directly take the air inlet temperature of the server as a control parameter to control the air conditioner. Thus, the controller may generate the control instruction in a real-time and dynamic manner according to the air inlet temperature and adjust the working mode of the air conditioner according to the control instruction. As a result, on one hand, the automatic control system of the chillers may avoid the refrigeration control strategy from being over circumspect which results in excessive refrigeration or being over radical which results in insufficient refrigeration on the premise of guaranteeing the server sufficient heat dissipation, thereby greatly reducing power consumption for refrigeration and the failure rate of the server. On the other hand, the automatic control system of the chillers may avoid labours from adjusting the refrigeration control strategy at regular intervals as many as possible, thus reducing labour cost, improving the operation and maintenance efficiency and meeting requirements to automatic and high efficient operation of the large scale data centre in the future.

Figure 2:
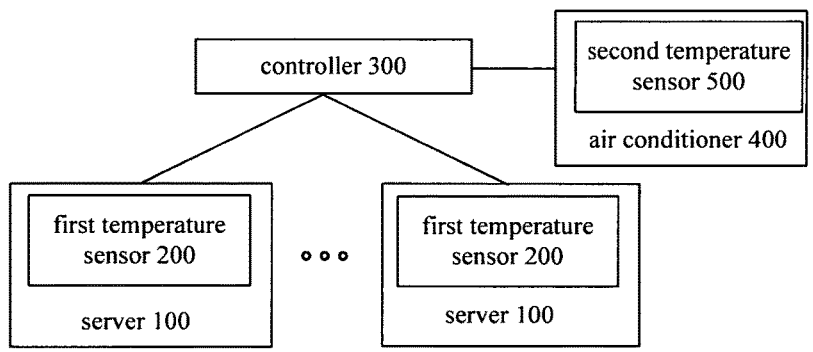
FIG. 2 is a schematic diagram showing an automatic control system of chillers for a data center according to a specific embodiment of the present disclosure.

FIG. 2 is a schematic diagram showing an automatic control system of chillers for a data center according to a specific embodiment of the present disclosure. As shown in FIG. 2, the automatic control system of the chillers for the data center includes a plurality of servers 100, a plurality of first temperature sensors 200, a controller 300, an air conditioner 400 and a second temperature sensor 500.

Specifically, in the above embodiment, as the control 300 receives the detected temperatures at the air inlets of the plurality of servers 100, thus the controller 300 needs to screen and process the detected temperatures of the plurality of servers 100 before generating the control instruction according to the average temperature in the data center, so that the controller 300 may calculate the average temperature in the data center based on the detected temperatures more accurately.

The automatic control system of the chillers for the data center is described in detail as below.

In an embodiment of the present disclosure, the controller 300 is configured to calculate a standard deviation based on the detected temperatures of the plurality of first temperature sensors 200, and determine whether the standard deviation is greater than a first predetermined threshold value. Specifically, the first predetermined threshold value may be a default value in the system, or a value set by the administrator according to different requirements. The standard deviation is obtained by extracting a square root of an arithmetic average of deviation square sum of the detected temperatures and the average temperature thereof of the plurality of servers 100. The standard deviation reflects a dispersion degree of the detected temperatures of the plurality of servers 100 received by the controller 300. The controller 300 is configured to correct the average temperature if the standard deviation is greater than the first predetermined threshold value.

More specifically, the controller 300 is configured to find a first detected temperature deviated from the average temperature among the detected temperatures if the standard deviation is greater than the first predetermined threshold value, that is, the controller 300 finds the first detected temperature of the plurality of servers 100 which is too high or low, and recalculates the average temperature in the data center based on other detected temperatures of the plurality of servers 100 excluding the deviate detected temperature. Furthermore, the controller 300 calculates the average temperature of all detected temperatures of the servers 100 if the standard deviation is less than or equal to the first predetermined threshold value, and the average temperature is taken as an average temperature in the data center. Furthermore, the controller 300 is configured to determine whether the first detected temperature is abnormal after finding the deviate detected temperature. Specifically, the controller 300 is configured to determine whether operation and maintenance information is present in a first predetermined range surrounding the first temperature sensor corresponding to the deviate detected temperature. The operation and maintenance information includes a fan being pulled out in the first predetermined range and/or a fan failure in the first predetermined range. The first predetermined range may be a default value in the system, or a value set by the administrator according to different requirements. The controller 300 determines that the first detected temperature is abnormal if the controller 300 determines that operation and maintenance information is present in the first predetermined range surrounding the first temperature sensor 200 corresponding to the deviate detected temperature. The controller 300 is configured to send out an alarm if it is determined that the first detected temperature is abnormal. For example, the first detected temperature is normally higher than the detected temperatures of other servers 100 surrounded in the first predetermined range if the fan is pulled out in the first predetermined range or the fan breaks down in the first predetermined range. Therefore, the controller 300 may determine the first detected temperature is abnormal and send an alarm of higher temperature to alert the administrator. The controller 300 may correct the average temperature in the data center after it is determined that the first detected temperature is abnormal. For example, the controller 300 may find the abnormal first detected temperature and recalculate the average temperature in the data center again based on other detected temperatures excluding the abnormal deviate detected temperature. If it is determined that the operation and maintenance information is absent in the first predetermined range surrounding the first temperature sensor 200 corresponding to the deviate detected temperature, the controller 300 may calculate a difference between the detected temperatures of the first temperature sensors 200 in a second predetermined range surrounding the first temperature sensor 200 corresponding to the first detected temperature and the abnormal detected temperature. If the difference is greater than the second predetermined threshold value, the controller 300 determines that the first detected temperature is abnormal. The second predetermined range and the second predetermined threshold may be default values in the system, or values set by the administrator according to different requirements. More specifically, the controller 300 may compare the first detected temperature with the detected temperatures of other servers 100 in the second predetermined range, and calculate an absolute value of the difference between the first detected temperature and the detected temperatures of other servers 100 in the second predetermined range. If it is determined that the absolute value of the difference between the first detected temperature and the detected temperatures of other servers 100 in the second predetermined range is greater than the second predetermined threshold value, the controller 300 may determine that the first detected temperature is abnormal. In other words, a reading of the first temperature sensor 200 may be abnormal. After it is determined that the first detected temperature is abnormal, the controller 300 may find the abnormal first detected temperature and recalculate the average temperature in the data center based on the detected temperatures of other servers 100 excluding the abnormal deviate detected temperature.

It should be understood that, if there are a plurality of the first detected temperatures enabling the absolute value of the difference between the first detected temperature and the detected temperatures of other servers 100 in the second predetermined range to be greater than the second predetermined threshold value, the controller 300 may also obtain a ratio of the number of the first detected temperatures enabling the absolute value of the difference between the first detected temperature and the detected temperatures of other servers 100 in the second predetermined range to be greater than the second predetermined threshold value, to the number of the detected temperatures of other servers 100 excluding the detected temperatures. If this ratio is greater than a certain predetermined threshold value, the controller 300 determines that the first detected temperature is abnormal and sends the alarm, so as to alert the administrator abnormality.

Furthermore, if the absolute value of the difference is less than the second predetermined threshold value, the controller 300 determines that the first detected temperature is normal and corrects the detected temperatures of the plurality of first temperature sensors 200 in the second predetermined range with the deviate detected temperature. Specifically, if it is determined that the absolute value of the difference between the first detected temperature and the detected temperatures of other servers 100 in the second predetermined range is less than the second predetermined threshold value, and the first detected temperature is greater than the detected temperatures of other servers 100 in the second predetermined range, the controller 300 corrects the temperature values of other detected temperatures in the second predetermined range with the deviate detected temperature, and recalculates the average temperature in the data center with the detected temperature after correction. Otherwise, if it is determined that the absolute value of the difference between the first detected temperature and the detected temperatures of other servers 100 in the second predetermined range is less than the second predetermined threshold value, and the first detected temperature is less than the detected temperatures of other servers 100 in the second predetermined range, the controller 300 corrects the first detected temperature with a higher detected temperature of other detected temperatures in the second predetermined range, and recalculates the average temperature in the data center with the detected temperature after correction.

According to embodiments of the present disclosure, the automatic control system of the chillers for the data center screens out an abnormal and deviate value among the detected temperatures detected by the first temperature sensor according to the standard deviation calculated with the detected temperatures of the plurality of the servers, and determines the first detected temperatures combining with the operation and maintenance information in the data centre, so as to further improve precision of the average temperatures in the data center, such that the air conditioner may be of an optimal air supply temperature theoretically, thereby further guaranteeing the servers in the data center the safety. In an embodiment of the present disclosure, the automatic control system of the chillers for the data center further includes the second temperature sensor 500. Specifically, the second temperature sensor 500 is mounted at an air outlet of the air conditioner 400 and configured to detect a temperature at the air outlet of the air conditioner 400 in a real-time manner.

Preferably, the controller 300 is further configured to receive the temperature at the air outlet of the air conditioner 400 sent by the second temperature sensor 500 and generate the control instruction according to the temperature at the air outlet of the air conditioner 400 and the average temperature of the servers 100. Specifically, the controller 300 may be further configured to generate the control instruction according to different control strategy in addition to the ways described in the above embodiment. For example, the controller 300 may calculate the standard deviation of the detected temperatures. If it is determined that the standard deviation is abnormal, the detected temperature may be determined to be abnormal. Then, the controller 300 may generate the control instruction according to the temperature at the air outlet of the air conditioner 400 detected by the second temperature sensor 500 and control the air conditioner 400 to adjust the working mode itself according to the control instruction, thereby further guaranteeing the servers in the data center the safety.

For another example, if it is determined that the temperature at the air outlet of the air conditioner 400 is greater than the average temperature in the data center, the controller 300 generates the control instruction according to the temperature at the air outlet of the air conditioner 400. Specifically, the controller 300 may be further configured to determine which one of the detected temperatures at the air inlet of the server 100 detected by the first temperature sensor 200 and at the air outlet of the air conditioner 400 detected by the second temperature sensor 500 is higher. If the detected temperature at the air inlet of the server 100 detected by the first temperature sensor 200 is less than the detected temperature at the air outlet of the air conditioner 400 detected by the second temperature sensor 500, the controller 300 generates the control instruction according the temperature at the air outlet of the air conditioner 400; If the detected temperature at the air inlet of the server 100 detected by the first temperature sensor 200 is greater than the detected temperature at the air outlet of the air conditioner 400 detected by the second temperature sensor 500, the controller 300 generates the control instruction according the temperature at the air inlet of the server 100, thus further avoiding the servers 100 from being overheating locally, and further reducing the power consumption of the refrigeration and the failure rate of the server.

In order to achieve the embodiments described above, the present disclosure further provides in some embodiments an automatic control method of chillers for a data center.

Figure 3:
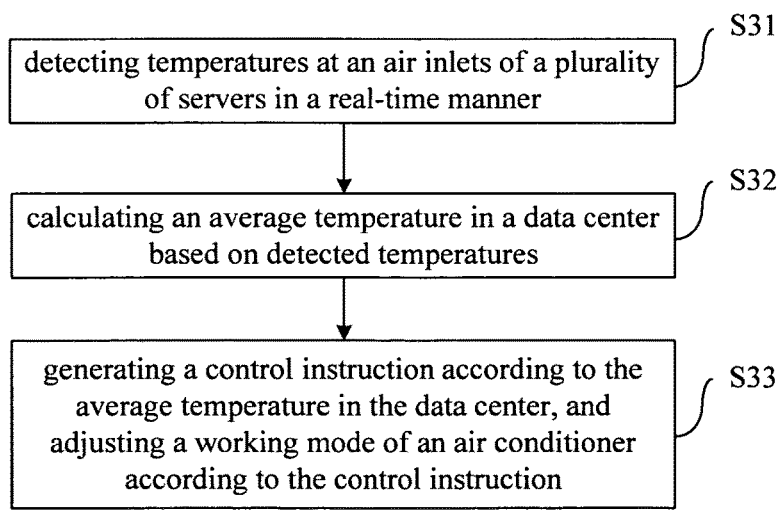
FIG. 3 is a flow chart showing an automatic control method of chillers for a data center according to an embodiment of the present disclosure.

FIG. 3 is a flow chart showing an automatic control method of chillers for a data center according to an embodiment of the present disclosure.

As shown in FIG. 3, the automatic control method of the chillers for the data center includes the following steps. S31, the temperatures at the air inlets of the plurality of servers are detected in a real-time manner.

For example, the temperature at the air inlet of the server may be detected by the temperature sensor in a real-time manner. Specifically, the temperature sensor may be mounted at the air inlet of the server. Normally, one data center may be provided with a plurality of servers. In order to detect the detected temperatures of the plurality of servers in a real-time manner, the temperature sensor may be disposed at the air inlet of each server, in which one temperature sensor may be disposed at the air inlet of each server, or two or more temperature sensors may also be disposed at the air inlet of each server.

S32, the average temperature in the data center is calculated based on detected temperatures.

Specifically, after detecting the detected temperatures, the arithmetic mean value may be calculated based on the detected temperatures and the arithmetic mean value obtained by calculating based on the detected temperatures is taken as the average temperature in the data center.

S33, the control instruction is generated according to the average temperature in the data center, and the working mode of the air conditioner is adjusted according to the control instruction.

Specifically, the control instruction may be generated according to the average temperature in the data center, and the control instruction may be send to the air conditioner. More specifically, after receiving the control instruction, the air conditioner may adjust the working mode accordingly. Specifically, the working mode may include a rotation rate of a fan, a refrigeration temperature of the air conditioner. In other words, air supply quantity and air temperature of the air conditioner may be adjusted to meet the requirements to the air supply quantity and the air temperature at the air inlet of the server, so as to ensure the server being operated stably.

Furthermore, the air conditioner controlling an opening rate of the freeze water valve of a coiler end of the air conditioner is taken as an example. The air conditioner obtains a control temperature to be adjusted according to the control instruction, and then compares the control temperature with a current air supply temperature of the air conditioner. If the control temperature is greater than the air supply temperature, the air conditioner may control freeze water supply pipe valve to decrease the opening rate of the freeze water supply pipe valve, so as to increase the current air supply temperature of the air conditioner. If the control temperature is less than the air supply temperature, the air conditioner may control the freeze water supply pipe valve to increase the opening rate of the freeze water supply pipe valve, so as to decrease the current air supply temperature of the air conditioner.

Furthermore, the air conditioner controlling the rotation rate of the fan in the air conditioner 400 is also taken as an example. The air conditioner controls the rotation rate of the fan in the air conditioner according to the control instruction. Based on the design of the server, a relationship between a ventilation quantity and the rotation rate of the fan in the server may be established in advance. This relationship may be measured by a related technique, e.g., a wind tunnel test, which is no elaborated herein. Preferably, the air supply quantity of the fan in the air conditioner may be equal to the air quantity required by all servers in the machine room, i.e., the air supply quantity of the fan is equal to a sum of the ventilation quantities of all servers. Therefore, the rotation rate of the fan may be adjusted in a real-time manner according to the sum of the ventilation quantities of all servers, so as to reduce power consumption by the fan and avoid the cold aisles from backflow and detour flow caused by an over air supply quantity or an overheat air supply, thus reducing the power consumption by the refrigeration of the air conditioner.

According to embodiments of the present disclosure, the automatic control method of the chillers for the data center may detect the air inlet temperature of the server in a real-time manner, and may directly take the air inlet temperature of the server as a control parameter to control the air conditioner. Thus, the controller may generate the control instruction in a real-time and dynamic manner according to the air inlet temperature and adjust the working mode of the air conditioner according to the control instruction. As a result, on one hand, the automatic control system of the chillers may avoid the refrigeration control strategy from being over circumspect which results in excessive refrigeration or being over radical which results in insufficient refrigeration on the premise of guaranteeing the server sufficient heat dissipation, thereby greatly reducing power consumption for refrigeration and the failure rate of the server. On the other hand, the automatic control system of the chillers may avoid labours from adjusting the refrigeration control strategy at regular intervals as many as possible, thus reducing labour cost, improving the operation and maintenance efficiency and meeting requirements to automatic and high efficient operation of the large scale data centre in the future.

Figure 4:
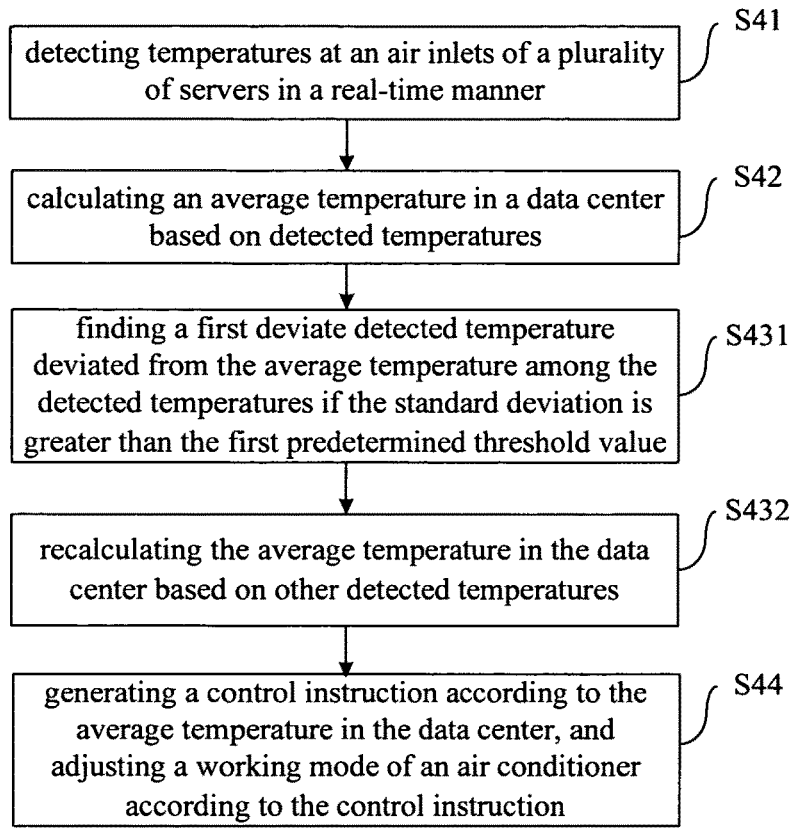
FIG. 4 is a flow chart showing an automatic control method of chillers for a data center according to a specific embodiment of the present disclosure.

FIG. 4 is a flow chart showing an automatic control method of chillers for a data center according to a specific embodiment of the present disclosure.

As shown in FIG. 4, the automatic control method of the chillers for the data center includes the following steps.

S41, the temperatures at the air inlets of the plurality of servers are detected in a real-time manner.

S42, the average temperature in the data center is calculated based on detected temperatures.

S43, the standard deviation of the detected temperatures is calculated. If the standard deviation is greater than the first predetermined threshold value, the average temperature is corrected.

Specifically, the first predetermined threshold value may be a default value in the system, or a value set by the administrator according to different requirements. The standard deviation is obtained by extracting a square root of an arithmetic average of deviation square sum of the detected temperatures and the average temperature thereof of the plurality of servers. The standard deviation reflects a dispersion degree of the detected temperatures of the plurality of servers received by the controller.

In an embodiment of the present disclosure, S43 specifically includes the following step.

S431, if the standard deviation is greater than the first predetermined threshold value, a first detected temperature deviated from the average temperature is found among the detected temperatures.

In an embodiment of the present disclosure, after finding the first detected temperature from the plurality of the detected temperatures, it is determined that whether the first detected temperature is abnormal. In specific, it may be determined that whether operation and maintenance information is present in a first predetermined range surrounding the first temperature sensor corresponding to the deviate detected temperature. The operation and maintenance information includes a fan being pulled out in the first predetermined range and/or a fan failure in the first predetermined range. The first predetermined range may be a default value in the system, or a value set by the administrator according to different requirements. If it is determined that the operation and maintenance information is present in the first predetermined range surrounding the first temperature sensor corresponding to the deviate detected temperature, then the first detected temperature is determined to be abnormal. The alarm is sent out if it is determined that the first detected temperature is abnormal. For example, if the fan is pulled out in the first predetermined range or the fan breaks down in the first predetermined range, then the first detected temperature is normally higher than the detected temperatures of other servers in the first predetermined range surrounding the deviate detected temperature. Therefore, it may be determined that the first detected temperature is abnormal, and thus sending out the alarm for the higher temperature to alert the administrator.

If it is determined that the operation and maintenance information is absent in the first predetermined range surrounding the first temperature sensor corresponding to the deviate detected temperature, a difference between the detected temperatures of the first temperature sensors in a second predetermined range surrounding the first temperature sensor corresponding to the first detected temperature and the abnormal detected temperature may be calculated. If the difference is greater than the second predetermined threshold value, it is determined that the first detected temperature is abnormal. The second predetermined range and the second predetermined threshold may be default values in the system, or values set by the administrator according to different requirements. More specifically, the first detected temperature may be compared with the detected temperatures of other servers in the second predetermined range, and an absolute value of the difference between the first detected temperature and the detected temperatures of other servers in the second predetermined range is calculated. If it is determined that the absolute value of the difference between the first detected temperature and the detected temperatures of other servers in the second predetermined range is greater than the second predetermined threshold value, the first detected temperature may be determined to be abnormal, and thus sending out the alarm for the higher temperature to alert the administrator.

It should be understood, if there are a plurality of the first detected temperatures enabling the absolute value of the difference between the first detected temperature and the detected temperatures of other servers in the second predetermined range to be greater than the second predetermined threshold value, it may further obtain a ratio of the number of the first detected temperatures enabling the absolute value of the difference between the first detected temperature and the detected temperatures of other servers in the second predetermined range to be greater than the second predetermined threshold value, to the number of the detected temperatures of other servers excluding the detected temperatures. If this ratio is greater than a certain predetermined threshold value, the first detected temperature may be determined to be abnormal, and thus sending out the alarm for the higher temperature to alert the administrator.

Furthermore, if the absolute value of the difference is less than the second predetermined threshold value, the first detected temperature may be determined to be normal, then the detected temperatures in the second predetermined range may be corrected with the deviate detected temperature. Specifically, if it is determined that the absolute value of the difference between the first detected temperature and the detected temperatures of other servers in the second predetermined range is less than the second predetermined threshold value, and the first detected temperature is greater than the detected temperatures of other servers in the second predetermined range, then the temperature values of other detected temperatures in the second predetermined range may be corrected with the deviate detected temperature, and the average temperature in the data center may be recalculated with the detected temperature after correction. Otherwise, if it is determined that the absolute value of the difference between the first detected temperature and the detected temperatures of other servers in the second predetermined range is less than the second predetermined threshold value, and the first detected temperature is less than the detected temperatures of other servers in the second predetermined range, then the first detected temperature may be corrected with a higher detected temperature of other detected temperatures in the second predetermined range.

S432, the average temperature in the data center is recalculated based on other detected temperatures.

Specifically, if it is determined that the first detected temperature is abnormal, the abnormal first detected temperature may be found, and the average temperature in the data center may be recalculated based on the detected temperatures of other servers excluding the abnormal deviate detected temperature.

S44, the control instruction is generated according to the average temperature in the data centre, and the working mode of the air conditioner may be adjusted according to the control instruction.

According to embodiments of the present disclosure, the automatic control method of the chillers for the data center screens out an abnormal and deviate value among the detected temperatures according to the standard deviation calculated with the detected temperatures of the plurality of the servers, and determines the first detected temperatures combining with the operation and maintenance information in the data centre, so as to further improve precision of the average temperatures in the data center, such that the air conditioner may be of an optimal air supply temperature theoretically, thereby further guaranteeing the servers in the data center the safety.

Figure 5:
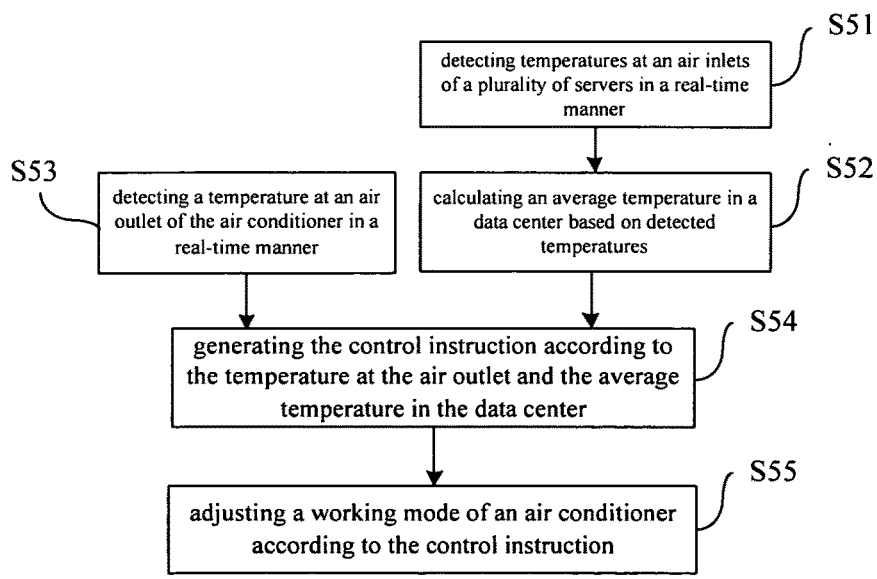
FIG. 5 is a flow chart showing an automatic control method of chillers for a data center according to another specific embodiment of the present disclosure.

FIG. 5 is a flow chart showing an automatic control method of chillers for a data center according to another specific embodiment of the present disclosure.

As shown in FIG. 5 the automatic control method of the chillers for the data center includes the following steps.

S51, the temperatures at the air inlets of the plurality of servers are detected in a real-time manner.

S52, the average temperature in the data center is calculated based on detected temperatures.

S53, the temperature at an air outlet of the air conditioner is detected in a real-time manner.

Specifically, the temperature sensor may be mounted at the air outlet of the air conditioner and the temperature at the air outlet may be detected in a real-time manner by the temperature sensor.

S54, the control instruction is generated according to the temperature at the air outlet and the average temperature in the data center.

In an embodiment of the present disclosure, the standard deviation of the detected temperatures may be calculated. If the standard deviation is greater than the first predetermined threshold value, the control instruction is generated according to the temperature at the air outlet of the air conditioner. Specifically, the standard deviation of the detected temperatures may be calculated. If the standard deviation is greater than the first predetermined threshold value, then it may be determined that the first detected temperature is present in the detected temperatures. Thus, the control instruction may be generated according to the temperature at the air outlet of the air conditioner.

In another embodiment of the present disclosure, if it is determined that the temperature at the air outlet of the air conditioner is greater than the average temperature in the data center, the control instruction is generated according to the temperature at the air outlet of the air conditioner.

Furthermore, it should be understood, it may further determine that one of the detected temperatures at the air inlet of the server and at the air outlet of the air conditioner is higher. If the detected temperature at the air inlet of the server is less than the detected temperature at the air outlet of the air conditioner, then the control instruction is generated according the temperature at the air outlet of the air conditioner; If the detected temperature at the air inlet of the server is greater than the detected temperature at the air outlet of the air conditioner, then the control instruction is generated according the temperature at the air inlet of the server. As a result, the control instruction is generated according to the higher detected temperature for controlling the working mode of the air conditioner, so as to further avoid the servers from being overheating locally, and thereby reducing the power consumption of the refrigeration and the failure rate of the server.

S55, the working mode of the air conditioner is adjusted according to the control instruction.

According to embodiments of the present disclosure, the automatic control method of the chillers for the data center detects the temperatures at the air inlets of the plurality of the servers and at the air outlet of the air conditioner in a real-time manner, and generates the control instruction according to the temperature at the air outlet of the air conditioner and the average temperature in the data center, such that t the air conditioner may be of an optimal air supply temperature theoretically, so as to further avoid the server from being overheating locally, and thereby reducing the power consumption of the refrigeration and the failure rate of the server.

In order to achieve the embodiments described above, the present disclosure further provides in embodiments a storage medium for use in storing an application, configured to perform the automatic control method of the chillers for the data center during being operated.

According to embodiments of the present disclosure, the storage medium detects the temperatures at the air inlets of the plurality of the servers and at the air outlet of the air conditioner in a real-time manner, and generates the control instruction according to the temperature at the air outlet of the air conditioner and the average temperature in the data center, such that t the air conditioner may be of an optimal air supply temperature theoretically, so as to further avoid the server from being overheating locally, and thereby reducing the power consumption of the refrigeration and the failure rate of the server.

It should be understood that each part of the present disclosure may be realized by the hardware, software, firmware or their combination. In the above embodiments, a plurality of steps or methods may be realized by the software or firmware stored in the memory and executed by the appropriate instruction execution system. For example, if it is realized by the hardware, likewise in another embodiment, the steps or methods may be realized by one or a combination of the following techniques known in the art: a discreet logic circuit having a logic gate circuit for realizing a logic function of a data signal, an application-specific integrated circuit having an appropriate combination logic gate circuit, a programmable gate array (PGA), a field programmable gate array (FPGA), etc.

Reference throughout this specification to "an embodiment", "some embodiments", "an example", "a specific example", or "some examples", means that a particular feature, structure, material, or characteristic described in connection with the embodiment or example is included in at least one embodiment or example of the present disclosure. Thus, the appearances of the phrases in various places throughout this specification are not necessarily referring to the same embodiment or example of the present disclosure. Furthermore, the particular features, structures, materials, or characteristics may be combined in any suitable manner in one or more embodiments or examples. In addition, those skilled in the art may combine and composite different embodiments or examples and features of various embodiments or examples embodiment described in the description with no conflicting situation.

Although explanatory embodiments have been shown and described, it would be appreciated by those skilled in the art that the above embodiments are exemplary and may not be construed to limit the present disclosure, and changes, alternatives, and modifications may be made in the embodiments within the scope of the present disclosure.

What is claimed is:

1. An automatic control system of chillers for a data center, comprising:
    a plurality of servers;
    a plurality of first temperature sensors, mounted at air inlets of the plurality of servers, respectively, and configured to detect temperatures at the air inlets of the plurality of servers in a real-time manner, respectively;
    a controller, configured to receive detected temperatures sent by the plurality of first temperature sensors, calculate an average temperature in the data center based on the detected temperatures, and generate a control instruction according to the average temperature in the data center; and
    an air conditioner, configured to receive the control instruction sent by the controller, and adjust a working mode of the air conditioner according to the control instruction,
    wherein the controller is further configured to:
    calculate a standard deviation based on the detected temperatures; and
    correct the average temperature if the standard deviation is greater than a first predetermined threshold value;
    wherein if the standard deviation is greater than the first predetermined threshold value, the controller is further configured to:
    find a first detected temperature deviated from the average temperature among the detected temperatures; and
    recalculate the average temperature in the data center based on other detected temperatures.

2. The automatic control system according to claim 1, wherein after finding the deviate detected temperature, the controller is further configured to:
    determine whether the first detected temperature is abnormal; and
    recalculate the average temperature in the data center based on other detected temperatures if it is determined that the first detected temperature is abnormal.

3. The automatic control system according to claim 2, wherein the controller is further configured to:
    determine whether operation and maintenance information is present in a first predetermined range surrounding the first temperature sensor corresponding to the deviate detected temperature; and
    determine that the first detected temperature is abnormal if the operation and maintenance information is determined to be present in a first predetermined range surrounding the first temperature sensor corresponding to the deviate detected temperature.

4. The automatic control system according to claim 3, wherein if it is determined that the operation and maintenance information is absent in a first predetermined range surrounding the first temperature sensor corresponding to the deviate detected temperature, the controller is further configured to:
    calculate a difference between the detected temperatures of the plurality of first temperature sensors in a second predetermined range surrounding the first temperature sensor corresponding to the first detected temperature and an abnormal detected temperature;
    determine that the first detected temperature is abnormal if the difference is greater than a second predetermined threshold value;
    determine that the first detected temperature is normal if the difference is less than the second predetermined threshold value; and
    correct the detected temperatures of the plurality of first temperature sensors in the second predetermined range with the deviate detected temperature.

5. The automatic control system according to claim 2, wherein the controller is further configured to send out an alarm if it is determined that the first detected temperature is abnormal.

6. The automatic control system according to claim 3, wherein the operation and maintenance information comprises at least one of a fan being pulled out in the first predetermined range and a fan failure in the first predetermined range.

7. The automatic control system according to claim 1, further comprising:
a second temperature sensor, mounted at an air outlet of the air conditioner and configured to detect a temperature at the air outlet of the air conditioner in a real-time manner.

8. The automatic control system according to claim 7, wherein the controller is further configured to:
receive the temperature at the air outlet of the air conditioner sent by the second temperature sensor; and
generate the control instruction according to the temperature at the air outlet of the air conditioner and the average temperature in the data center.

9. The automatic control system according to claim 8, wherein the controller is further configured to:
calculate the standard deviation based on the detected temperatures, and
generate the control instruction according to the temperature at the air outlet of the air conditioner if the standard deviation is greater than the first predetermined threshold value.

10. The automatic control system according to claim 8, wherein the controller is further configured to generate the control instruction according to the temperature at the air outlet of the air conditioner if it is determined by the controller that the temperature at the air outlet of the air conditioner is greater than the average temperature in the data center.

11. An automatic control method of chillers for a data center, comprising:
detecting temperatures at an air inlets of a plurality of servers in a real-time manner;
calculating an average temperature in a data center based on detected temperatures; and
generating a control instruction according to the average temperature in the data center, and adjusting a working mode of an air conditioner according to the control instruction,
wherein, after calculating the average temperature in the data center based on the detected temperatures, further comprising:
calculating a standard deviation based on the detected temperatures, and
correcting the average temperature if the standard deviation is greater than a first predetermined threshold value;
wherein correcting the average temperature comprises:
finding a first detected temperature deviated from the average temperature among the detected temperatures if the standard deviation is greater than the first predetermined threshold value; and
recalculating the average temperature in the data center based on other detected temperatures.

12. The automatic control method according to claim 11, after finding the deviate detected temperatures, further comprising:
determining whether the first detected temperature is abnormal, and
recalculating the average temperature in the data center based on other detected temperatures if it is determined that the first detected temperature is abnormal.

13. The automatic control method according to claim 12, wherein determining whether the first detected temperature is abnormal comprises:
determining whether operation and maintenance information is present in a first predetermined range surrounding the first temperature sensor corresponding to the deviate detected temperature; and
determining that the first detected temperature is abnormal if it is determined that the operation and maintenance information is present in the first predetermined range surrounding the first temperature sensor corresponding to the deviate detected temperature.

14. The automatic control method according to claim 13, after determining whether the first detected temperature is abnormal, further comprising:
calculating a difference between the detected temperatures of the first temperature sensors in a second predetermined range surrounding the first temperature sensor corresponding to the first detected temperature and an abnormal detected temperature if it is determined that the operation and maintenance information is absent in the first predetermined range surrounding the first temperature sensor corresponding to the deviate detected temperature;
determining the first detected temperature is abnormal if the difference is greater than a second predetermined threshold value; and
determining the first detected temperature is normal if the difference is less than the second predetermined threshold value and correcting the detected temperatures of the plurality of first temperature sensors in the second predetermined range with the deviate detected temperature.

15. The automatic control method according to claim 11, before generating the control instruction according to the average temperature in the data center, further comprising:
detecting a temperature at an air outlet of the air conditioner in a real-time manner; and
generating the control instruction according to the temperature at the air outlet and the average temperature in the data center.

16. A storage medium for used in storing an application, configured to perform the automatic control method by:
detecting temperatures at an air inlets of a plurality of servers in a real-time manner;
calculating an average temperature in a data center based on detected temperatures; and
generating a control instruction according to the average temperature in the data center, and adjusting a working mode of an air conditioner according to the control instruction,
wherein, after calculating the average temperature in the data center based on the detected temperatures, the application further configured to perform the automatic control method by:
calculating a standard deviation based on the detected temperatures, and
correcting the average temperature if the standard deviation is greater than a first predetermined threshold value;
wherein correcting the average temperature comprises:
finding a first detected temperature deviated from the average temperature among the detected temperatures if the standard deviation is greater than the first predetermined threshold value; and recalculating the average temperature in the data center based on other detected temperatures.

\* \* \* \* \*